United States Patent
Rickman (10) Patent No.: US 9,284,751 B2
(45) Date of Patent: Mar. 15, 2016

(54) HIGH SECURITY LOCKING ASSEMBLY FOR ABOVE-GROUND FIBER OPTIC/CABLE NETWORK ENCLOSURES

(71) Applicant: Channell Commercial Corp., Temecula, CA (US)

(72) Inventor: Gene E. Rickman, Temecula, CA (US)

(73) Assignee: Chanell Commercial Corp., Temecula, CA (US)

( * ) Notice: Subject to any disclaimer, the term of this patent is extended or adjusted under 35 U.S.C. 154(b) by 38 days.

(21) Appl. No.: 13/910,933

(22) Filed: Jun. 5, 2013

(65) Prior Publication Data

US 2014/0361551 A1 Dec. 11, 2014

(51) Int. Cl.

| E05C 19/00 | (2006.01) |
| E05B 65/00 | (2006.01) |
| E05C 19/18 | (2006.01) |
| H05K 5/00 | (2006.01) |

(52) U.S. Cl.
CPC ........... *E05B 65/0089* (2013.01); *E05C 19/003* (2013.01); *E05C 19/186* (2013.01); *H05K 5/00* (2013.01); *Y10T 292/1033* (2015.04)

(58) Field of Classification Search
CPC . E05B 65/0089; E05C 19/001; E05C 19/003; E05C 19/186; E05C 19/188; E05C 9/20; H05K 5/00; Y10T 292/1033
USPC ............ 292/155, 259 R, 262, 265, 266, 268, 292/269, 251, 288, 289, 292, DIG. 11; 70/14, 19, 211, 212, 202, 203; 312/245, 327, 328, 100; 174/561, 562
See application file for complete search history.

(56) References Cited

U.S. PATENT DOCUMENTS

| 2,330,975 | A | * | 10/1943 | Jackson ......................... 220/3.8 |
| 3,665,736 | A | * | 5/1972 | Wilson .................... E05B 73/00 |
| | | | | 292/259 R |
| 3,955,709 | A | * | 5/1976 | Coley et al. .................... 220/812 |
| 6,311,530 | B1 | * | 11/2001 | Woodward ........................ 70/19 |
| 6,553,797 | B2 | * | 4/2003 | Witchey .......................... 70/209 |
| 6,834,896 | B2 | * | 12/2004 | Smith ....................... 292/259 R |
| 6,990,838 | B2 | * | 1/2006 | Witchey ........................... 70/14 |
| 7,278,663 | B2 | * | 10/2007 | Witchey .................... 292/259 R |
| 7,299,668 | B1 | * | 11/2007 | Lu ..................................... 70/58 |
| 7,497,490 | B2 | * | 3/2009 | Yamaguchi ................... 292/262 |
| 7,546,018 | B2 | | 6/2009 | Hendrickson et al. |
| 8,056,945 | B2 | * | 11/2011 | Moreno ........................ 292/321 |
| 8,800,328 | B2 | * | 8/2014 | Dubbey ............................ 70/14 |
| 2011/0075968 | A1 | * | 3/2011 | Cao et al. ......................... 385/24 |
| 2013/0034336 | A1 | | 2/2013 | Cassell et al. |

* cited by examiner

*Primary Examiner* — Kristina Fulton
*Assistant Examiner* — Christine M Mills
(74) *Attorney, Agent, or Firm* — Lewis Roca Rothgerber Christie LLP (57) ABSTRACT

A high security locking assembly for an above-ground communications network enclosure comprises a claw-like structure having, at one end, a slide bar with an end plate that carries a first set of locking pins, and a base plate, at the other end, having an end plate that carries a second set of locking pins. The slide bar travels axially in a guide channel below a rigid frame that holds a captive locking bolt positioned to engage one of a series of axially spaced locking holes on the slide bar. The locking pins face one another and are adapted for sliding into corresponding locking pin holes in the sides of enclosure. The claw-like structure is closed by sliding the slide bar into the guide channel, and positioning the pins in the locking pin holes, followed by locking the captive locking bolt in a selected one of the locking holes.

9 Claims, 11 Drawing Sheets

HIGH SECURITY LOCKING ASSEMBLY FOR ABOVE-GROUND FIBER OPTIC/CABLE NETWORK ENCLOSURES

FIELD OF THE INVENTION

This invention relates to a tamper-proof security system for above-ground fiber optic/cable network enclosures. The invention provides a high level of security against vandalism and theft for remotely-located enclosures that deploy valuable electronics and cable network equipment.

BACKGROUND

Above-ground metal cabinets or enclosures are commonly used to remotely store valuable communication equipment serving as a link or interface between a service provider's fiber optic or cable network and individual subscribers or customers. These enclosures are typically placed above-ground on public rights-of-way or in the public areas of multiple dwelling unit residences, for example.

One of many examples of these enclosures has to do with multiple dwelling unit (MDU) enclosures, or "wall boxes" as they are often called, which are designed to provide cable service providers and their customers with protection against vandalism or theft. These wall boxes are typically designed for pre-wired and post-wired applications: The boxes provide pre-wired entry of drop cables and post-wired entry to allow system technicians to replace damaged parts, to upgrade the MDU site, or to provide new service connections.

These wall boxes, as well as other fiber optic/cable network enclosures generally, require a high level of security to protect the service providers and their customers. This problem is commonly addressed by using heavy-duty door locks or latch systems that usually require customized tools or security keys to allow entry to the service technicians. Although these types of security systems are suitable in most instances, a higher level of security is needed to prevent the door or cover plate from being pried open, even in the presence of these prior art locking systems.

SUMMARY OF THE INVENTION

Briefly, one embodiment of the invention comprises a high security locking assembly for a communications network enclosure containing terminal connections for electronics and cable network equipment. The enclosure comprises a box-like structure or chassis frame having a cover or door for access to the terminal connections. The locking assembly comprises a claw-like structure having a slide bar with a first end plate that carries a first set of locking pins, and an elongated rigid support structure disposed above the slide bar and having a second end plate that carries a second set of locking pins. The slide bar is adapted to travel axially in a front section of the support structure. The support structure includes a rigid carrier frame section for holding a captive locking bolt adapted to engage a selected one of a series of axially spaced apart locking holes on the slide bar. The locking pins face one another and are adapted for sliding into locking pin holes in opposing side walls of the enclosure. The claw-like structure is closed around the cover or door, by sliding the slide bar into the front section of the support structure, while positioning the pins in the locking pin holes, followed by locking the captive locking bolt in a selected one of the locking holes.

Components of the locking assembly are made of high strength metal and are integrally connected as one-piece rigid unit that resists bending or attempts to pry it open from its closed position.

These and other aspects of the invention will be more fully understood by referring to the following detailed description and the accompanying drawings.

DETAILED DESCRIPTION

The present invention relates to a high security locking assembly for above-ground communication network enclosures that provide cable or broadband communication services to the premises, for example. The invention is useful in providing tamper-proof installations for such enclosures generally, to protect the electronics and cable equipment inside them for the benefit of the various service providers and subscribers at the premises. The invention is useful in providing security for various types of enclosures or cabinets containing valuable network communications equipment, including utilities, telecommunications, CATV, broadband and wireless network equipment. The embodiment illustrated in the drawings is but one example of the use and function of the invention in carrying out the objectives described previously.

In one embodiment, the invention is applicable to wall boxes used for supplying communication services to multiple dwelling units, in this instance an enclosure called an MDU wall box. The MDU wall box is typically mounted on a wall, a pole, or other upright structure, and can contain a security lock to protect the terminal connections inside the box from vandalism and cable theft. These MDU boxes are typically designed to facilitate drop entry from time to time using various forms of locks or latching systems to facilitate access for replacing parts or adding new service connections, for example. Service technicians are commonly able to open these MDU boxes using a custom tool or security key to gain access. The improvement of the present invention goes further in providing a higher level of protection from vandalism or theft.

Figure 1:
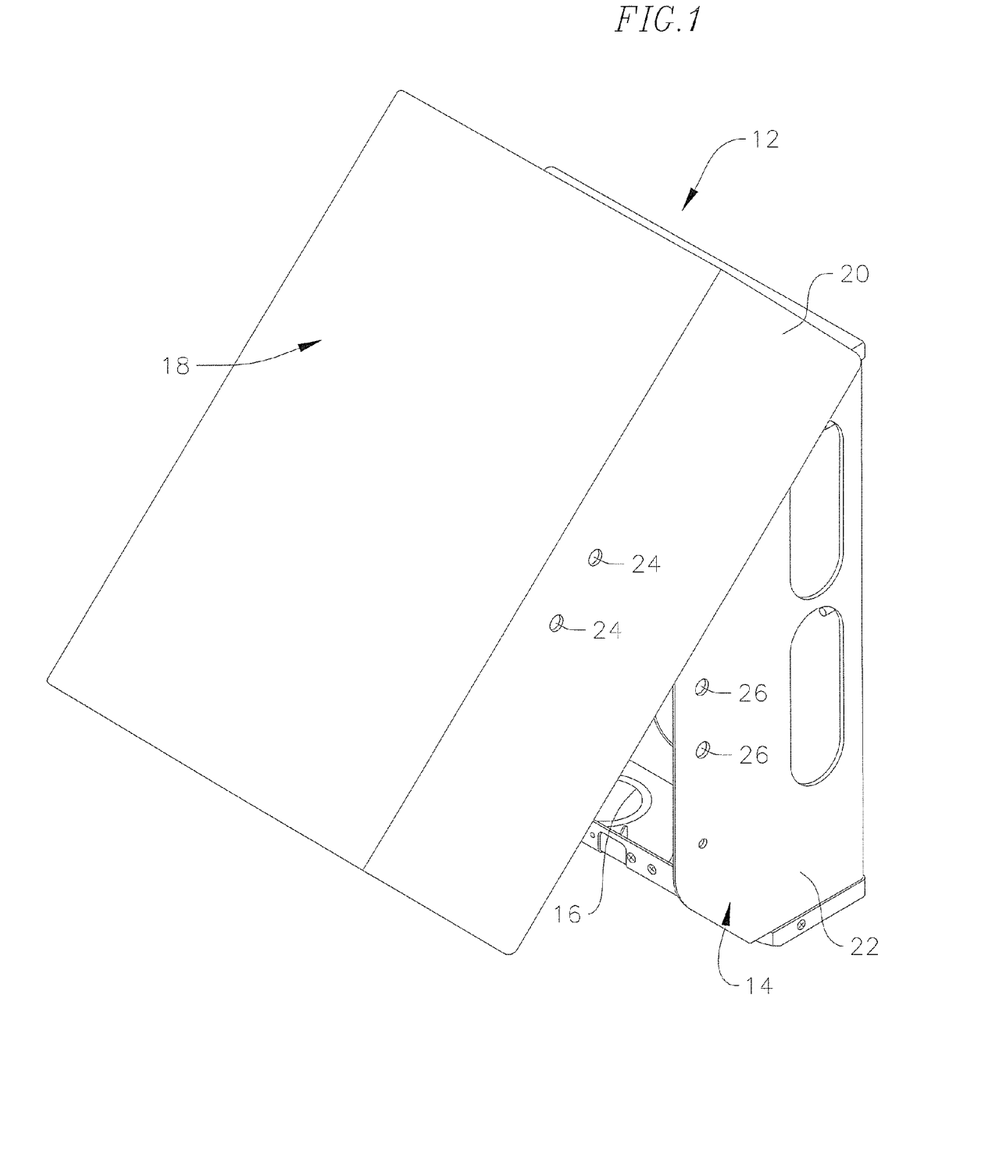
FIG. 1 is a perspective view showing a first step in a process for placing a high security locking assembly, according to principles of this invention, on an MDU enclosure.
Figure 2:
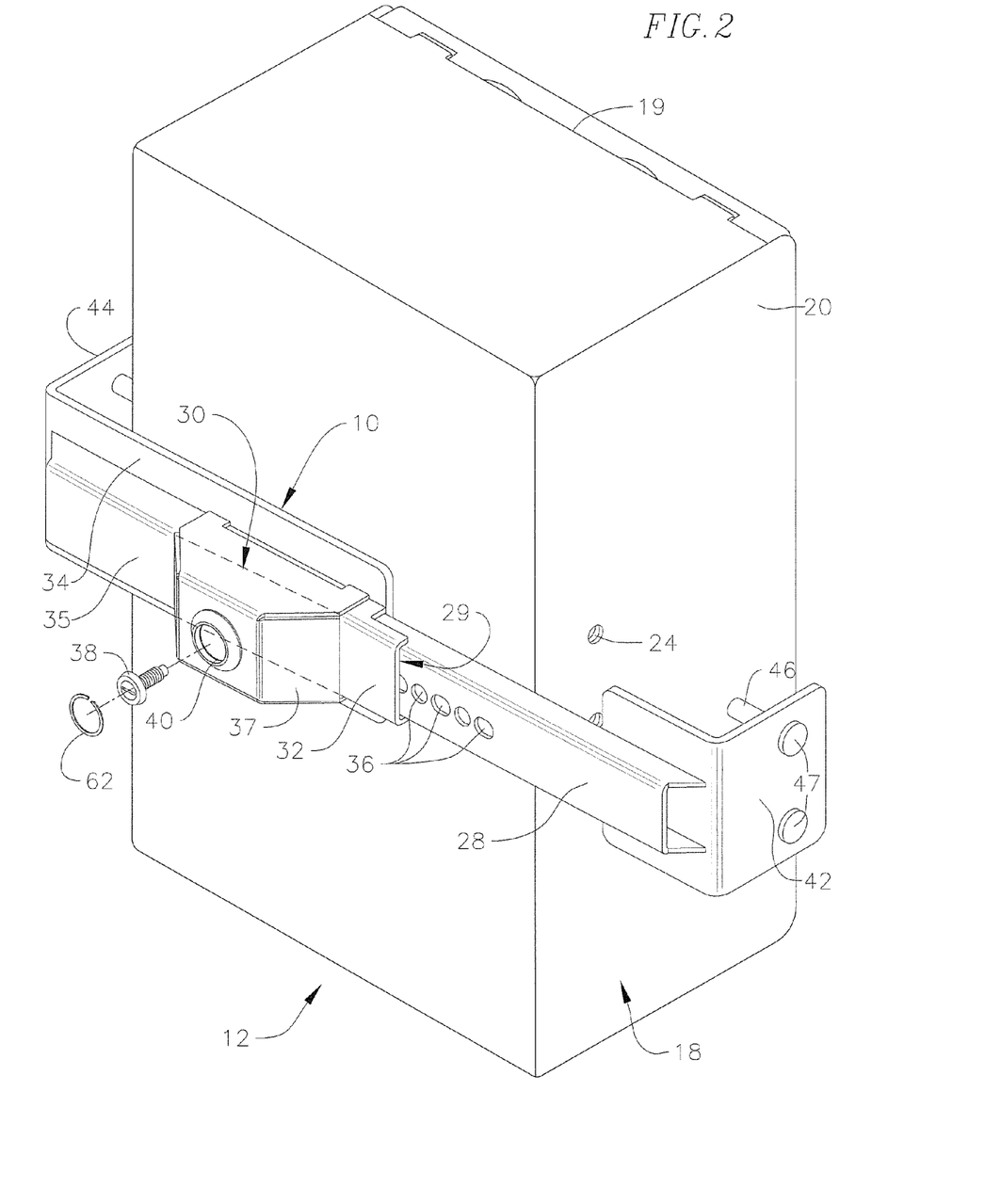
FIG. 2 is a perspective view showing a second step in the process of placing the locking assembly on the MDU enclosure.
Figure 3:
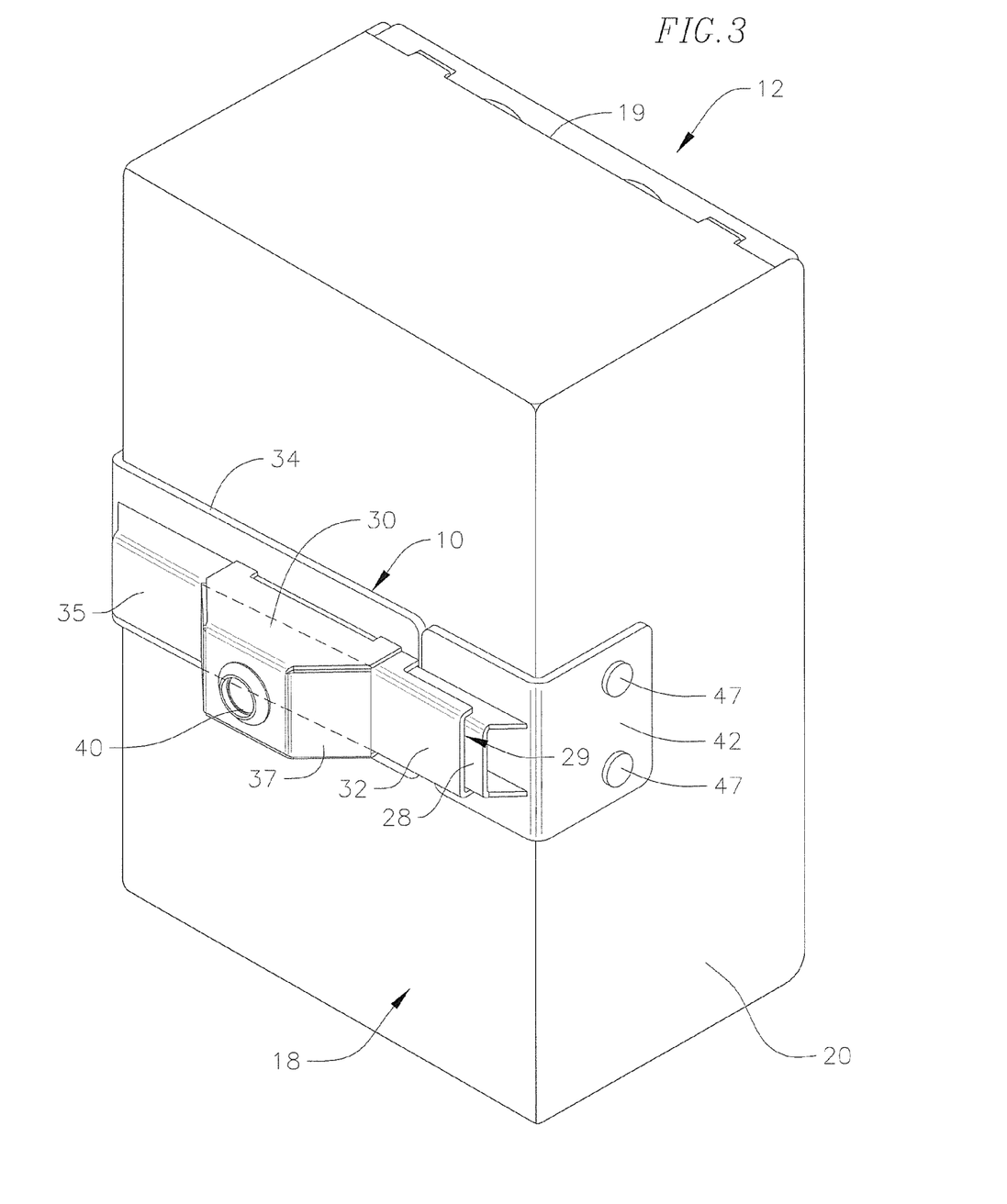
FIG. 3 is a perspective view showing a final step of having placed the locking assembly on the MDU enclosure.

Referring to the drawings, FIGS. 1-3 illustrate a sequence of steps involved in securing a locking assembly 10, according to this invention, to the front face of a wall box or cable enclosure 12. As mentioned, the wall box generally contains terminal connections for various types of communication services supplied to service subscribers at the premises. In the illustrated embodiment, the wall box 12 can include broadband or cable connections for a multiple dwelling unit subscriber, as an example of a type of wall box for which the present invention is adapted.

The illustrated wall box generally includes a chassis frame 14 having a box-like structure that would include a mounting plate (not shown) or the like to facilitate the internal wiring and cable connections for the MDU customers. The chassis frame also includes entry ports 16, typically at the bottom, for receiving a cable input from a cable service provider. The illustrated wall box comprises a "box inside a box" structure having a cover 18 hinged to a top of the chassis frame 14. The cover has an elongated hinge 19 across the top, with opposite side flanges 20 that overlap the side walls 22 of the chassis frame when the cover is rotated to its closed as shown in FIGS. 2 and 3.

As shown in FIG. 1, an initial step in using the locking assembly is to drill holes 24 in both side flanges 20 of the cover 18 and to drill cooperating holes 26 in both side walls 22 of the chassis frame 14. In the illustrated embodiment, a pair of vertically spaced apart holes are drilled in each side of the wall box. The holes in the cover's side flanges align with the holes in the chassis frame when the cover is rotated to its closed position shown in FIGS. 2 and 3.

The locking assembly 12 will first be referred to generally with respect to the illustrations in FIGS. 1-3, while its component parts are shown in more detail in FIGS. 4-11.

The locking assembly 10 comprises a claw-like structure which includes an elongated slide bar 28 adapted to slide axially in a channel 29 formed beneath a rigid, elongated inverted U-shaped support structure 30. An elongated inverted U-shaped front channel bar 32 is rigidly affixed to a front side of the support structure 30. The bottom edges of the front channel bar 32 are rigidly affixed to an elongated rigid base plate 34 that forms a bottom run of the channel 29 that receives the slide bar 28. An elongated inverted U-shaped rear channel bar 35 is rigidly affixed to the support structure on a side thereof opposite from the front channel bar 32. The edges of the rear channel bar 35 are rigidly affixed to the top of the base plate 34. In the illustrated embodiment the channel bars 32 and 35 are front and rear sections of a continuous one-piece channel bar, although alternatively, the channel bar sections 32 and 35 can be separate and aligned axially.

The slide bar 28 contains a series of axially spaced apart unthreaded locking holes 36. The slide bar is adapted to slide in the channel 29 formed between the support structure 30 and the base plate 34, for positioning any selected one of the locking holes below an inverted U-shaped box-like carrier frame section 37 of the support structure 30. A captive locking bolt 38 is secured inside a recessed fitting 40 carried by the frame section 37. The slide bar 28 positions a selected one of the locking holes below the locking bolt.

The locking assembly is secured to the wall box via end plates carried on the slide bar and on the base plate. These end plates include a first end plate 42 affixed to an outer end of the slide bar and a second right-angle end plate 44 formed integrally with an outer end of the base plate. The first end plate 42 carried by the slide bar holds a first pair of rigid locking pins 46 that face toward the second end plate 44 at the other end. The first locking pins 46 include heads 47 rigidly affixed to the outer face of the first end plate 42. The second end plate 44 carries a cooperating second pair of rigid locking pins 48 (see FIGS. 4A and 4B) that face toward the first pair of locking pins. The second locking pins include heads 49 rigidly affixed to the outer face of the second end plate 44.

In use, as the slide bar 28 travels in the channel 29, the assembly is able to shorten or widen the distance between the end plates and their locking pins. The locking pins are arranged to engage cooperating pairs of the locking pin holes 24 and 26 on the chassis frame and outer cover (as shown in FIG. 2). When the assembly is placed over the front of the box and closed by the slide bar, the locking pins are able to slide into the locking pin holes 36 to an adjusted closed locking position across the front face of the wall box, shown in FIG. 3. The locking bolt 38 then can be tightened so that is passes through one of the locking holes in the slide bar to complete locking of the locking assembly to the wall box.

Figure 4A:
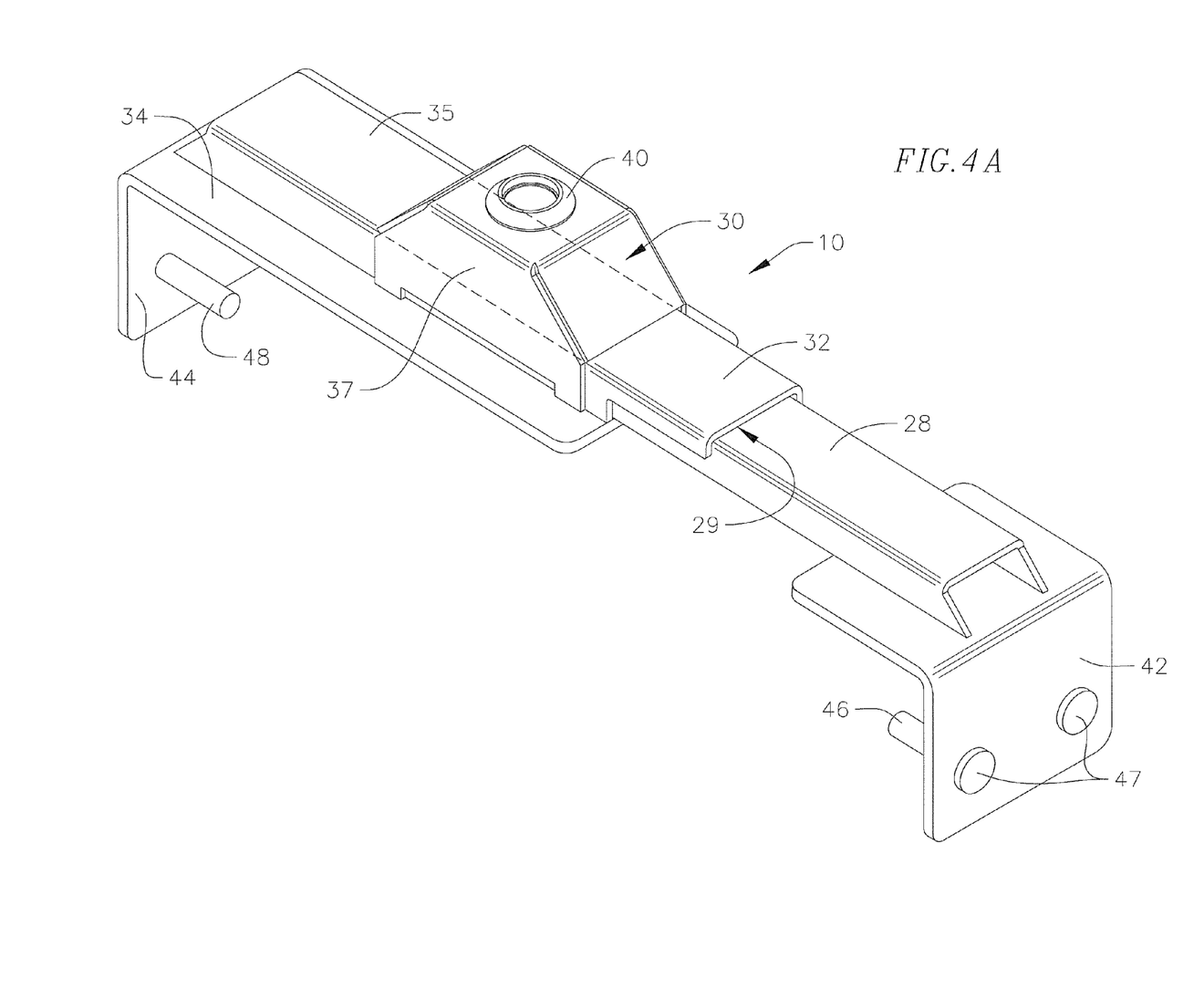
FIG. 4A is a perspective view showing components of the locking assembly in their assembled form, separated from the MDU enclosure.
Figure 4B:
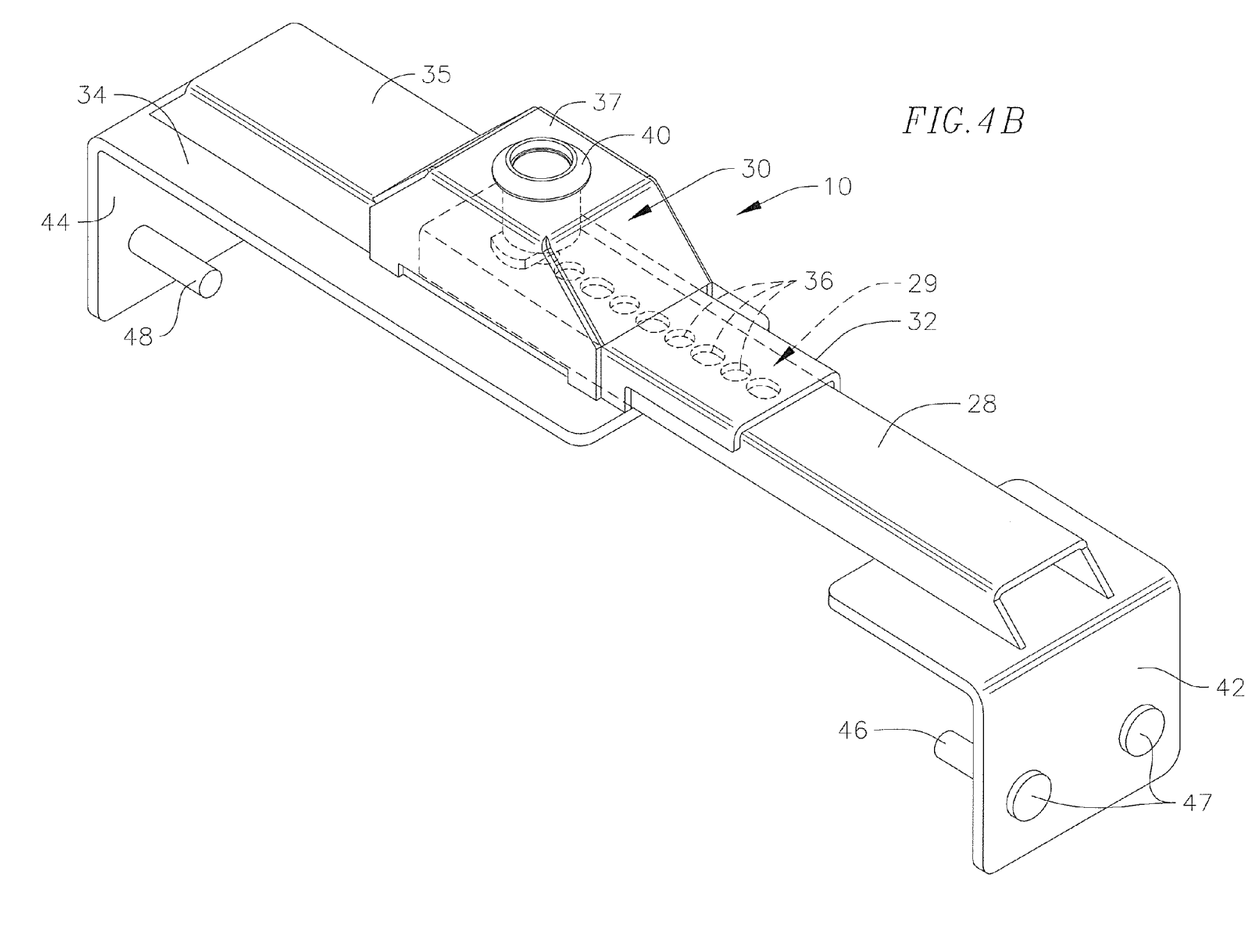
FIG. 4B is a perspective view similar to FIG. 4A but showing certain elements of the assembly in dotted lines to reveal components of the assembly otherwise obstructed in the view shown in FIG. 4A.

FIG. 4A shows a view of the locking assembly 10 in which the slide bar 28 has been moved to a closed position in the channel 29. In this instance the locking holes 36 on the slide bar are positioned inside the channel beneath the front channel bar 32. FIG. 4B shows the locking holes 36 in hidden lines.

Figure 5:
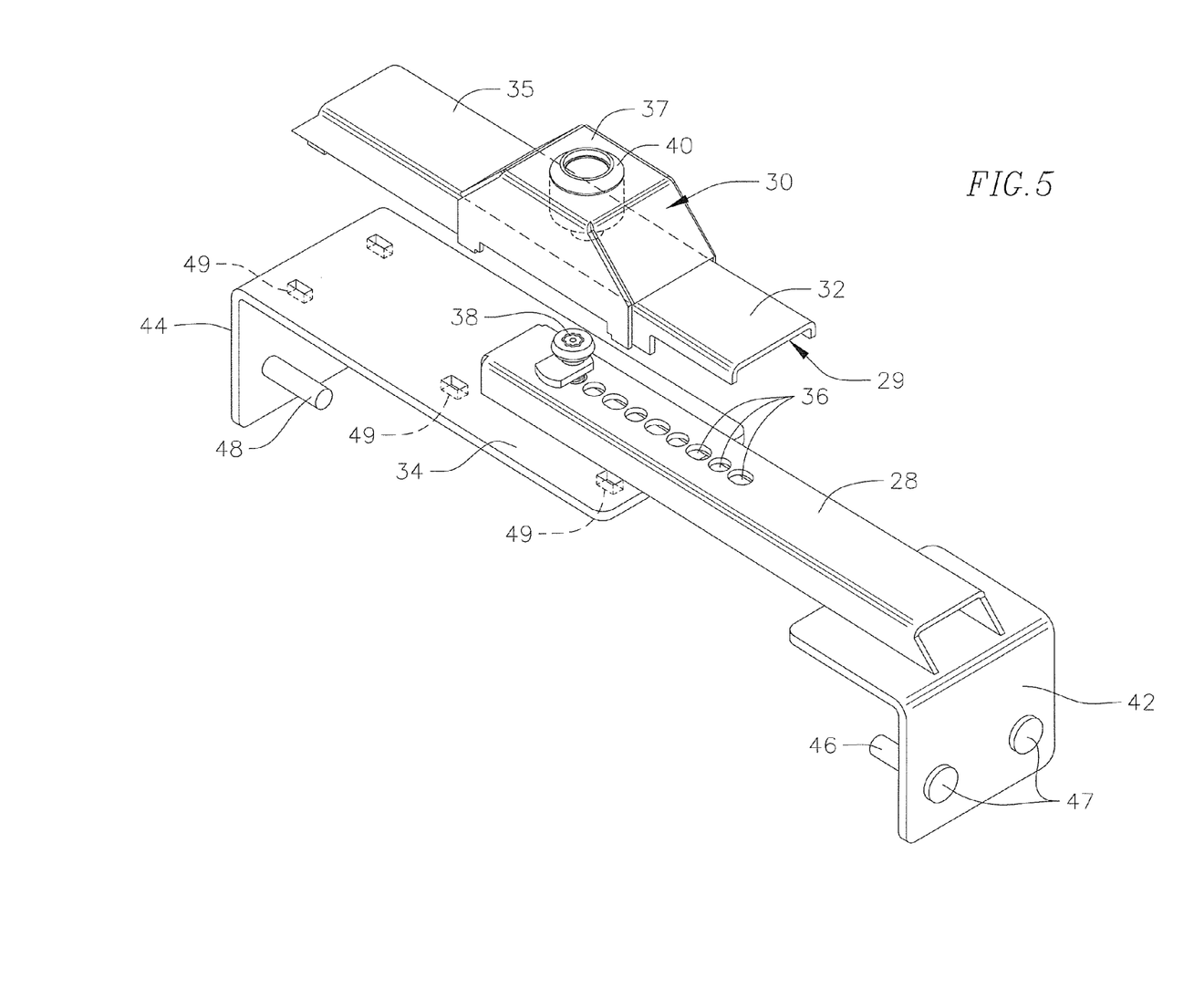
FIG. 5 is an exploded perspective view showing separate components of the locking assembly.

FIG. 5 shows the component parts of the locking assembly—the slide bar 28, support structure 30 and base plate 34—separated from one another. The box-like carrier frame section 37 and the front and rear channel bars 32, 35 are rigidly affixed to one another as a unit, to form the support structure 30. The bottom edges of this unit are rigidly secured at 49, by welding or the like, to the upper face of the base plate 34.

Figure 6:
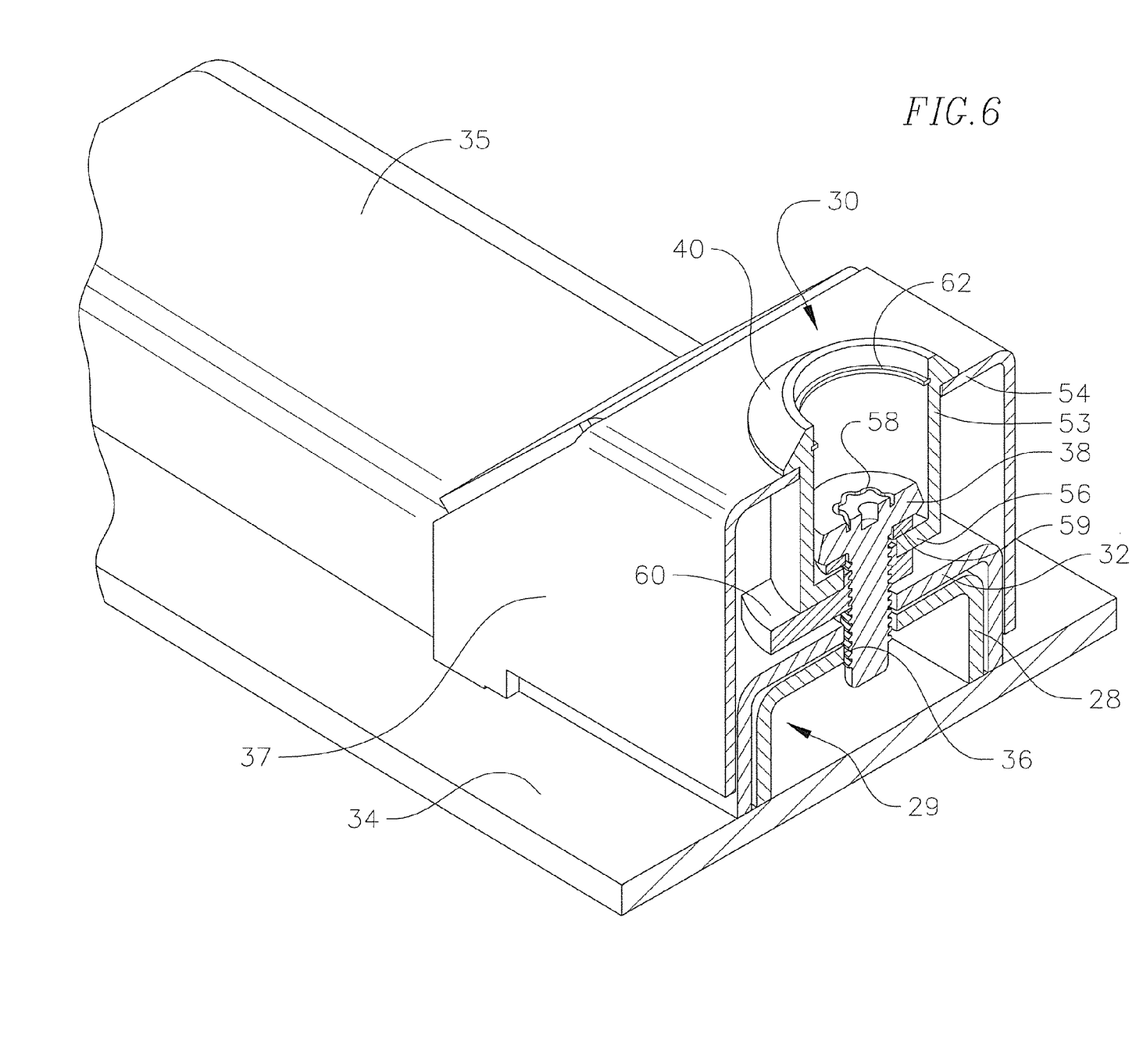
FIG. 6 is a fragmentary perspective view, partly in cross section, showing a captive locking bolt component of the locking assembly.
Figure 7:
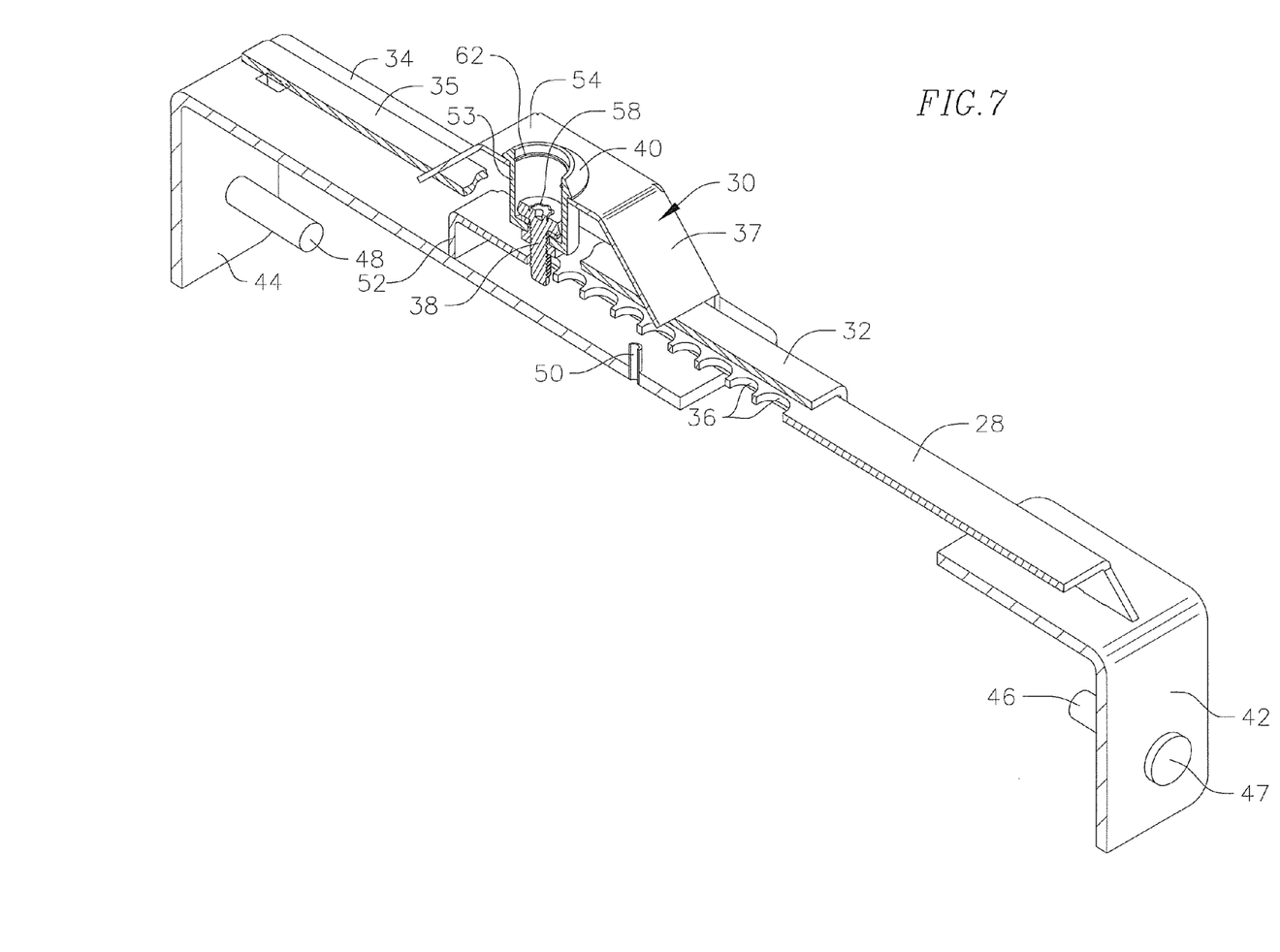
FIG. 7 is a perspective view, partly in cross section, showing a further view of the locking bolt component.
Figure 8:
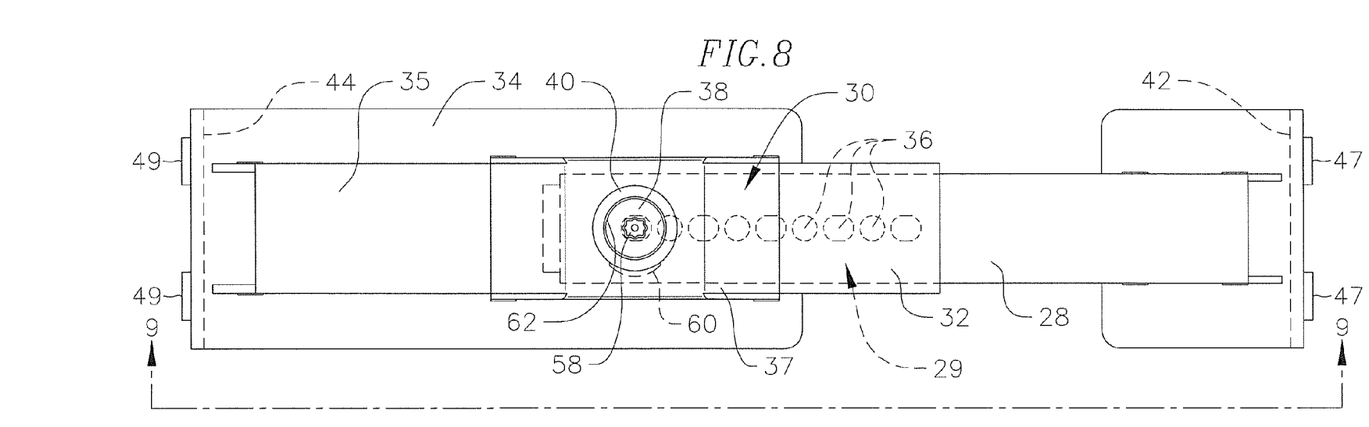
FIG. 8 is a top elevational view of the assembly shown in FIG. 4A.
Figure 9:
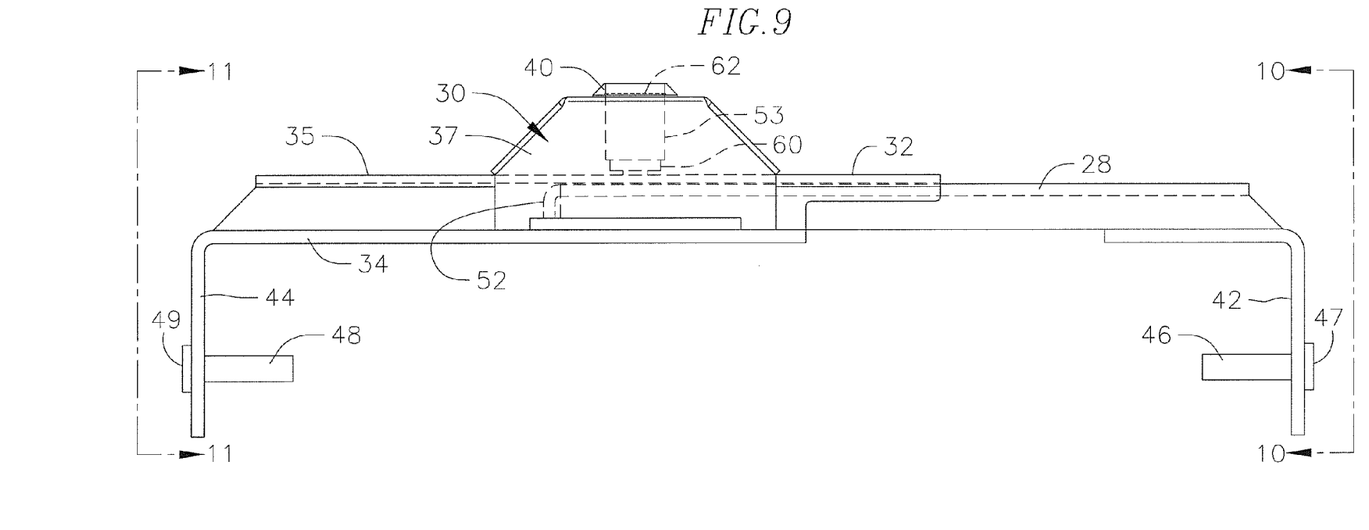
FIG. 9 is a side elevational view taken on line 9-9 of FIG. 8.
Figure 10:
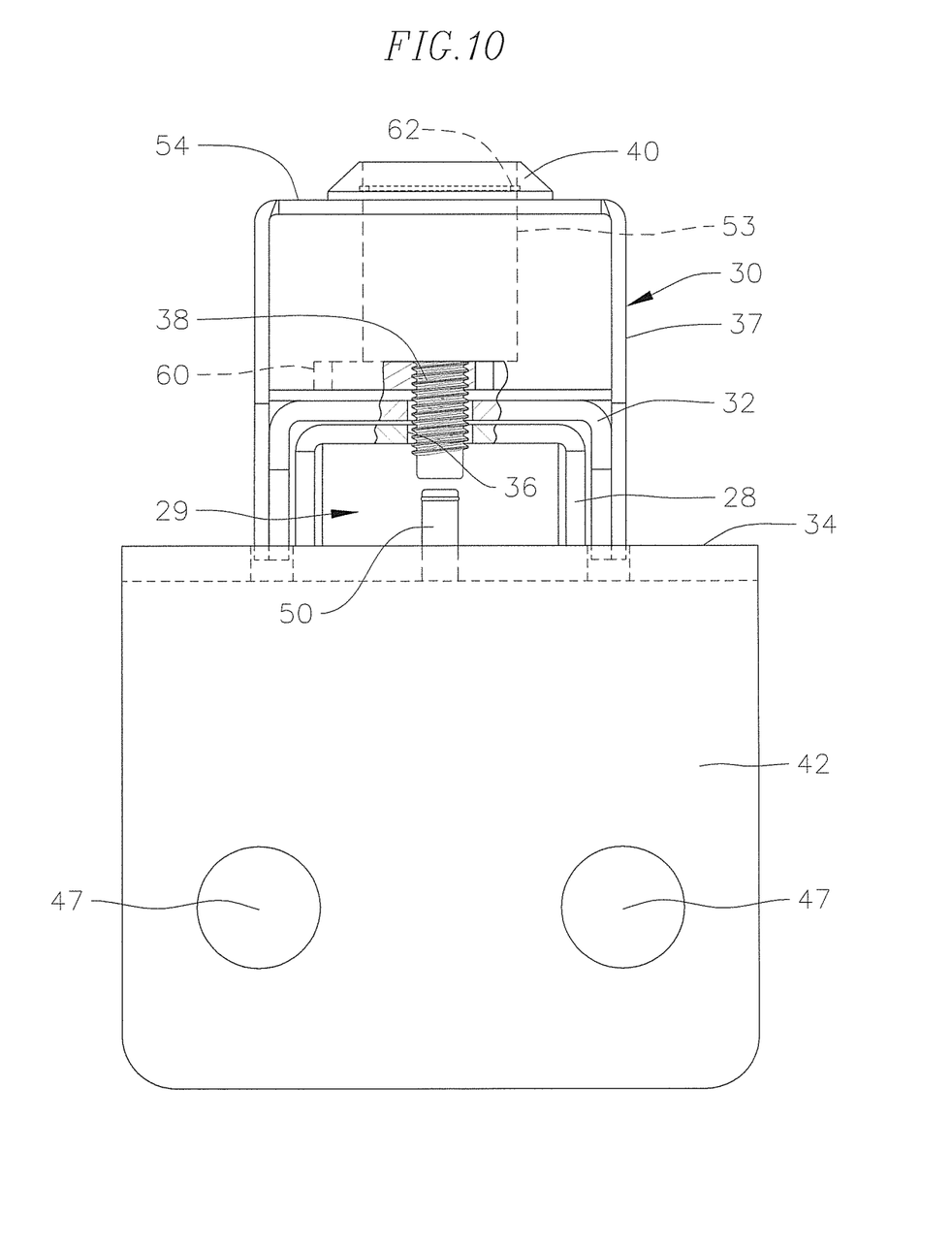
FIG. 10 is an end elevational view, partly broken away, taken on line 10-10 of FIG. 8.
Figure 11:
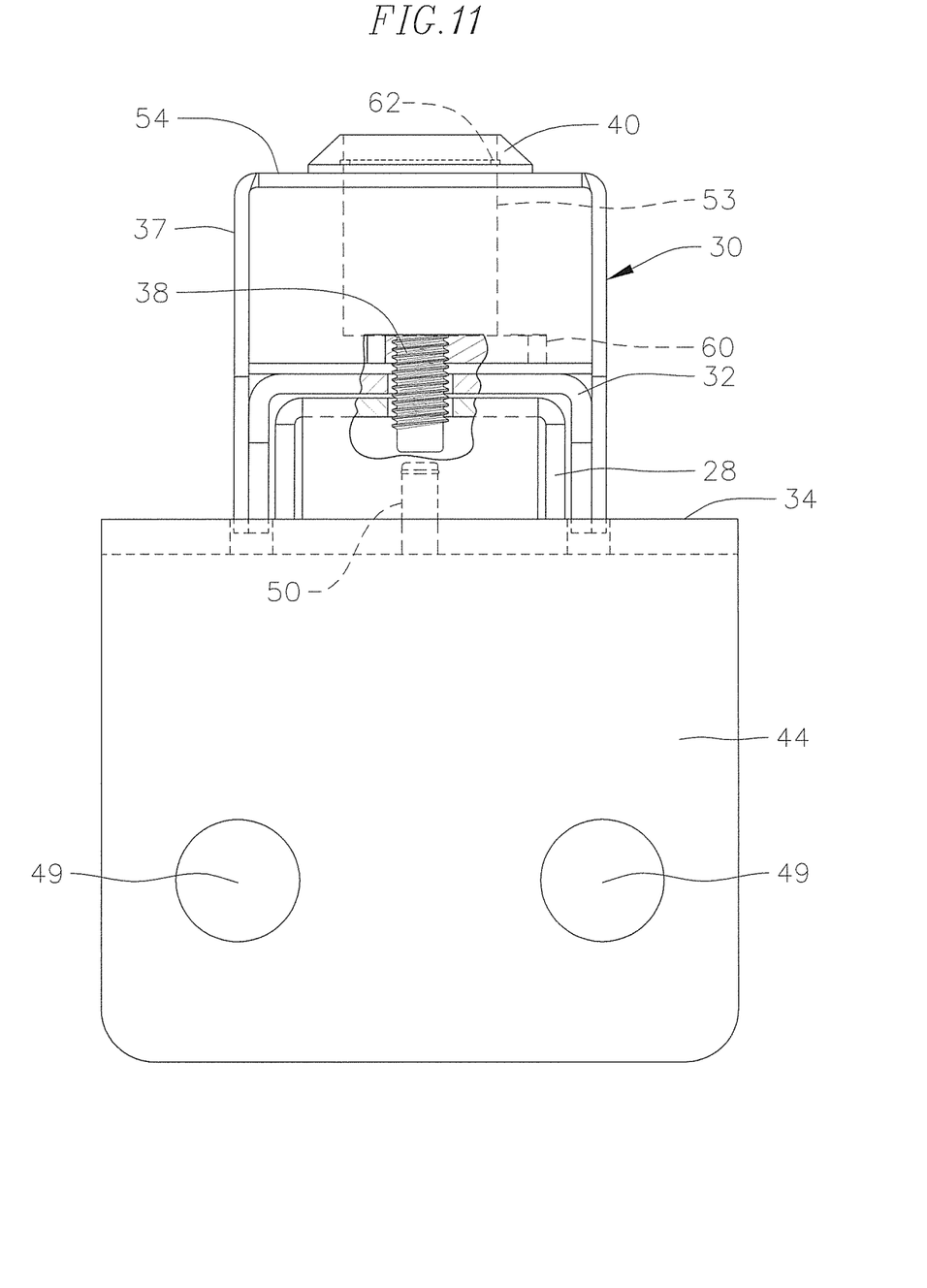
FIG. 11 is an end elevational view, partly broken away, taken on line 11-11 of FIG. 8.

FIGS. 6 and 7 show an example of the locking assembly in use with the slide bar 28 passing through the channel 29 formed inside the front channel bar 32. FIG. 7 best shows the locking bolt 38 engaged with one of the locking holes 36 for holding the slide bar in one of its fixed positions in the channel.

An upright rigid post 50 is secured to the base plate 34, inside of the channel 29, to function as a stop that limits travel of the slide bar out of the channel. A rear wall 52 at the end of the slide bar engages the stop to limit the slide bar's travel from the front channel bar 32.

FIGS. 6 through 11 show one embodiment of the captive locking bolt 38. In this embodiment the fitting 40 comprises a generally cylindrical boss 53 positioned in a bore in the top of the carrier frame section 37. The top of the cylindrical boss is rigidly affixed to an upper face 54 of the carrier frame section. The bottom of the cylindrical boss 53 has a base 56 with a (non-threaded) bore in the center that receives the externally threaded shaft of the locking bolt 38 which is held captive in the cylindrical boss. The head of the locking bolt has a custom pattern at 58 adapted to receive a custom security tool or key used by a technician for rotating the locking bolt between locked or unlocked positions in the slide bar 28. As mentioned, the embodiment shown in FIG. 6 illustrates positioning of the locking bolt in one of its locked positions—passing into one of the locking holes 36 in the slide bar 28. In the illustrated embodiment, the locking holes 36 are non-threaded holes that receive the threaded shaft of the locking bolt in a close-tolerance fit. Positioning the locking bolt in any one of the locking holes locks the slide bar to the front channel bar 32.

The locking bolt 38, in its locked position, shown in FIG. 6, passes through a lock washer 59 on the base of the cylindrical boss 53. The threaded shaft of the locking bolt also passes through a (non-threaded) bore in the top face of the front channel bar 32. The shaft is then threaded through an internally threaded hole in a rigid metal insert or weld nut 60 positioned below the base 56 of the cylindrical boss, between the boss and the top of the channel bar 32. The weld nut 60 is rigidly affixed to the bottom of the base 56, preferably by welding, in the opening through the base 56. When the locking bolt is positioned above the selected locking hole, the bolt is tightened against the lock washer and threaded through the weld nut 60 into the locking hole to hold the bolt under tension.

When the locking bolt is rotated away from its locked position, to an unlocked position, the threaded shaft of the locking bolt disengages from its position in the locking hole 36. The locking bolt is held captive in the threaded connection to the weld nut 60. The bolt will run out of threads when backing it out but will stay engaged with the weld nut. A retaining ring 62 positioned in the boss, above the bolt, retains the bolt inside the boss. The captive locking bolt shown in the illustrated embodiment is one alternative of a captive structure for allowing a locking bolt or another locking element to be releasably positioned in a locking hole or detent while retaining it so that it does not become separated from the locking device.

The locking assembly is constructed to provide a high level of security, in particular, to prevent being pried open from its locked position on the wall box. The main rigid components of the locking device—the slide bar 28, the front and rear channel bars, the base plate 34, the box-like structure 37, and the wrap-around end plates—are made of 14 gauge to 6 gauge steel sheet and steel plate. All metal parts are welded together to form a rigid structure. The locking pins 46, 48 are made of ⅜th inch steel rivets, with 1⅝ inch long pins, to resist the locking device being pried open from its closed position on the wall box.

The locking device of this invention has been subjected to various tests, such as attempts to pry it open with a crowbar. The invention resists bending in these tests as well as passing other structural integrity tests to which it may be exposed during use.

What is claimed is:

1. A high security locking enclosure for a communications network containing terminal connections for electronics and cable network equipment, the enclosure comprising:
   a chassis frame having a cover for access to the terminal connections, each of the chassis frame and the cover having locking pin holes in opposing side walls;
   a slide bar with a first end plate that carries a first set of locking pins, and an elongated rigid support structure disposed above the slide bar and having a second end plate that carries a second set of locking pins;
   the slide bar adapted to travel axially in a front section of the support structure;
   the support structure including a rigid carrier frame section for holding a captive locking bolt adapted to engage a selected one of a series of axially spaced apart locking holes on the slide bar;
   the first set of locking pins and the second set of locking pins face one another and slide into the locking pin holes in the opposing side walls of the chassis frame and cover, by sliding the slide bar into the front section of the support structure, while positioning the first set of locking pins and the second set of locking pins in the locking pin holes, followed by locking the captive locking bolt in a selected one of the locking holes,
   wherein the carrier frame section includes a recessed boss for containing the captive locking bolt, and a threaded insert rigidly affixed to a bottom of the boss, the captive locking bolt comprising a threaded shaft that screws into the threaded insert for maintaining the captive locking bolt in a selected one of the locking holes.

2. The enclosure according to claim 1 in which the first end plate and the second end plate are wrap-around steel plates, and the first set of locking pins and the second set of locking pins are steel rivets welded to the steel plates.

3. The enclosure according to claim 1 in which the carrier frame section is rigidly affixed to an elongated inverted U-shaped channel bar that forms the front section and a rear section of the support structure, and in which the channel bar is rigidly affixed to an elongated rigid base plate to form a channel that contains the slide bar and aligns its axial travel.

4. A high security locking enclosure containing a communications network's terminal connections for communication services supplied to a service subscriber, the enclosure comprising:
   a hinged cover having locking pin holes; and
   a structure having opposite side walls each having a locking pin hole engaged by a locking assembly which comprises:
   an elongated slide bar having a series of axially spaced apart locking holes on an upper surface thereof,
   a first end plate on an end of the slide bar,
   at least one first locking pin on an inside face of the first end plate,
   an elongated rigid base plate having an upper surface positioned below the slide bar,
   a second end plate on an end of the base plate,
   at least one second locking pin secured to an inside face of the second end plate, the first and second locking pins facing toward one another, the first and second locking pins engage the locking pin holes in the side walls of the enclosure and the hinged cover,
   the slide bar slidable axially along the axis of the base plate to widen or shorten the distance between the first and second end plates, and
   an elongated support structure rigidly affixed to the base plate and spaced above the upper surface of the base plate to form a channel therewith for receiving sliding axial travel of the slide bar in the channel,
   the support structure having a captive locking bolt adapted to engage a selected one of the locking holes in the slide bar for holding the slide bar in a fixed locking position in the channel relative to the base plate, with the spacing between the locking pins controlled by the selected locking hole engaged by the captive locking bolt,
   wherein the support structure includes a recessed boss for containing the captive locking bolt, and a threaded insert rigidly affixed to a bottom of the boss, the captive locking bolt comprising a threaded shaft that screws into the threaded insert for maintaining the captive locking bolt in a selected one of the locking holes.

5. The enclosure according to claim 4 in which the first end plate and the second end plate are wrap-around steel plates, and the first and second locking pins are steel rivets welded to the steel plates.

6. The enclosure according to claim 4 in which the support structure includes an elongated front channel bar, and in which the front channel bar is rigidly affixed to the base plate to form a front section of the channel that contains the slide bar.

7. An multiple dwelling unit wall box and high security locking assembly, comprising:
   a multiple dwelling unit wall box having a chassis frame containing terminal connections for network communication services for a service subscriber, and a hinged cover on the chassis frame, the chassis frame comprising a structure having opposite side walls engaged by the locking assembly in a closed position; and a locking assembly for locking the hinged cover to a front side of the chassis frame, wherein the locking assembly comprises:

an elongated slide bar having a series of axially spaced apart locking holes on an upper surface thereof, a first end plate on an end of the slide bar, at least one first locking pin secured to an inside face of the first end plate, an elongated base plate having an upper surface positioned below the slide bar, a second end plate on an end of the base plate, at least one second locking pin secured to an inside face of the second end plate, the first and second locking pins facing toward one another, wherein the first and second locking pins engage corresponding aligned locking pin holes in the side walls of the chassis frame and the hinged cover, the slide bar slidable axially along the axis of the base plate to widen or shorten the distance between the first and second end plates, and an elongated support structure rigidly affixed to the base plate and spaced above the upper surface of the base plate to form a channel therewith for receiving sliding axial travel of the slide bar in the channel, the support structure having a captive locking bolt adapted to engage a selected one of the locking holes in the slide bar for holding the slide bar in a fixed locking position in the channel relative to the base plate, with the spacing between the locking pins controlled by the selected locking hole engaged by the captive locking bolt, wherein the support structure includes a recessed boss for containing the captive locking bolt, and a threaded insert rigidly affixed to a bottom of the boss, the captive locking bolt comprising a threaded shaft that screws into the threaded insert for maintaining the captive locking bolt in a selected one of the locking holes.

8. The assembly according to claim 7 in which the first end plate and the second end plate are wrap-around steel plates, and the first and second locking pins are steel rivets welded to the steel plates.

9. The assembly according to claim 7 in which the support structure includes an elongated front channel bar, and in which the front channel bar is rigidly affixed to the base plate to form a front section of the channel that contains the slide bar.

* * * * *